(12) United States Patent
Brown (10) Patent No.: US 6,330,688 B1
(45) Date of Patent: Dec. 11, 2001

(54) ON CHIP ERROR CORRECTION FOR DEVICES IN A SOLID STATE DRIVE

(75) Inventor: Dave M. Brown, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 944 days.

(21) Appl. No.: 08/550,825

(22) Filed: Oct. 31, 1995

(51) Int. Cl.[7] ............... H02H 3/05; H03K 19/003; H04B 1/74; H04L 1/22
(52) U.S. Cl. ............... 714/7; 365/201; 365/200
(58) Field of Search .................. 395/182.03, 182.04, 395/182.05, 182.06; 371/10.2, 10.3, 21.1, 21.6, 51.1; 365/200, 201, 185.09, 218, 51; 714/7, 5, 710, 711; 711/154

(56) References Cited

U.S. PATENT DOCUMENTS

| | | | |
|---|---|---|---|
| 5,473,753 | * 12/1995 | Wells et al. | 714/5 |
| 5,490,264 | * 2/1996 | Wells et al. | 711/154 |
| 5,535,328 | * 7/1996 | Harari et al. | 714/7 |
| 5,544,118 | * 8/1996 | Harari | 365/218 |
| 5,691,945 | * 11/1997 | Liou et al. | 365/200 |

\* cited by examiner

*Primary Examiner*—Albert Decady
*Assistant Examiner*—Guy J. Lamarre
(74) *Attorney, Agent, or Firm*—Blakely, Sokoloff, Taylor & Zafman LLP (57) ABSTRACT

An error correction arrangement for a flash EEPROM array including a plurality of redundant array circuits, apparatus for sensing when a hardware error has occurred in a block of the flash EEPROM array, and a circuit for replacing an array circuit with a redundant array circuit in response to detection of a hardware error.

21 Claims, 4 Drawing Sheets

ON CHIP ERROR CORRECTION FOR DEVICES IN A SOLID STATE DRIVE

BACKGROUND OF THE INVENTION

1. Field Of The Invention

This invention relates to microprocessor controlled storage devices such as flash EEPROM memory arrays, and more particularly, to methods and apparatus for minimizing power consumption in such storage devices.

2. History of the Prior Art

Recently, storage devices such as flash electrically-erasable programmable read-only memory (EEPROM) arrays have been used as a new form of long term storage. A flash EEPROM memory array is constructed of a large plurality of floating-gate metal-oxide-silicon field effect transistor devices arranged as memory cells in typical row and column fashion with circuitry for accessing individual cells and placing the memory transistors of those cells in different memory conditions. Such memory transistors may be programmed by storing a charge on the floating gate. This charge remains when power is removed from the array. This charge (a "zero" or programmed condition) or its absence (a "one" or erased condition) may be detected when the device is read.

These arrays may be designed to provide a smaller lighter functional equivalent of an electromechanical hard disk drive which operates more rapidly and is not as sensitive to physical damage. Flash EEPROM memory arrays are especially useful in portable computers where space is at a premium and weight is extremely important. In order to allow flash EEPROM memory arrays to accomplish the storage functions normally accomplished by electromechanical hard disk drives, one type of flash memory manufactured by Intel Corporation of Santa Clara, Calif., utilizes on-chip control circuitry which is especially designed to respond to the commands and utilize the data furnished to accomplish the various read, write, and erase functions necessary to the storage and retrieval of data using a row and column array of flash devices. An advanced embodiment of this flash memory includes a microprocessor which exerts overall control of the functions of the storage array.

In general, a flash EEPROM memory array is divided into blocks of memory cells which are connected so that each entire block of memory cells may be erased simultaneously. Such an erasure places all of the devices in the block into the erased condition. Thereafter, a device may be individually programmed to store data.

Since all of the memory transistors of a block of the array are joined so that they may be erased together, a cell in a programmed condition cannot be switched to the erased state until the entire block of the array is erased. Thus, while an electro-mechanical hard disk drive typically stores information in a first area of the disk and then rewrites that same area of the disk when the information changes, this is not possible with a flash EEPROM memory array without erasing all of the valid information that remains in that block along with the invalid information. Consequently, in prior art arrangements, when the information at a data entry changes, the changed information is written to a new sector on a block of the array containing empty (erased) cells rather than written over the old data; and the old data is marked as invalid. Then, after a sufficient portion of a block has been marked invalid, the entire block is erased.

Because of this arrangement by which data is replaced, each block of the array will after some time have a number of invalid entries which cannot be used for storage. Consequently, the array fills with data as the data previously stored is changed; and a point will come when it is necessary to clear the invalid information from a block in order to provide space for new or changed information to be stored. When erasure of a block occurs, all of the remaining valid data stored in the block to be erased is written to a new block; the space from which the data was read is marked invalid; and then the entire invalid block is erased and put back into use as a clean block of memory. Consequently, there must be some number of blocks kept empty to accomplish the erase process.

Prior art forms of flash memories have provided error detection and correction arrangements. Because of this unique form of storage, if a hardware error occurs in a block of the array, it has been necessary to remove that block of the array from operation. Blocks of flash memory are relatively expensive compared to other forms of storage, so this is an undesirable characteristic. Moreover, since there are only a limited number of spare blocks of flash memory in an array, ultimately, this error correction approach limits the ability of the array to continue functioning.

It is desirable to provide a new form of error correction for flash EEPROM memory arrays which does not require the removal of blocks of flash memory from operation.

SUMMARY OF THE INVENTION

It is, therefore, an object of the present invention to provide an improved error correction arrangement for a flash EEPROM memory array.

This and other objects of the present invention are realized by an error correction arrangement for a flash EEPROM array including a plurality of blocks of row and column flash EEPROM devices, each of the blocks including a redundant array circuit, means for sensing when a hardware error has occurred in a block of the flash EEPROM array, and a circuit for replacing a bad array circuit with the redundant array circuit in response to detection of a hardware error.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
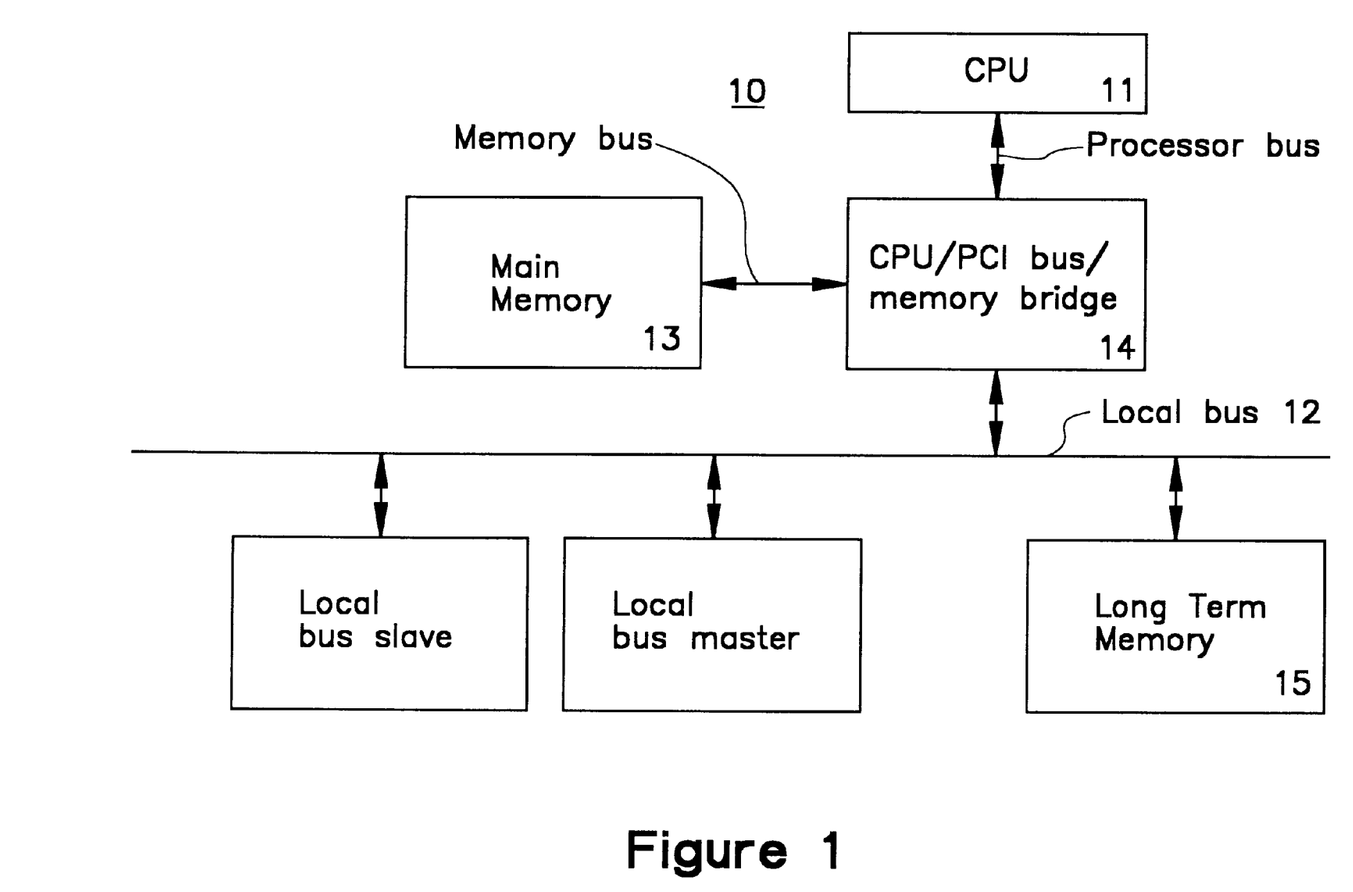
FIG. 1 is a block diagram of a computer system designed in accordance with the present invention.

Referring now to FIG. 1, there is illustrated a digital system 10 configured in accordance with one embodiment of the present invention. The present invention has application in any digital system and especially in a computer system utilizing flash EEPROM memory arrays. The system 10 illustrated includes a central processing unit 11 which executes the various instructions provided to control the operations of the system 10. The central processing unit 11 is typically joined by a processor bus to a bridge circuit 14 which controls access to an input/output bus 12 adapted to carry information between the various components of the system 10. The bridge circuit 14 is also joined by a memory bus to main memory 13 which is typically constructed of dynamic random access memory arranged in a manner well known to those skilled in the prior art to store information during a period in which power is provided to the system 10. In FIG. 1, the bus 12 is preferably a peripheral component interface (PCI) bus or other local bus adapted to provide especially fast transfers of data. This bus is chosen in FIG. 1 for illustrative purposes only.

In a typical system 10, various input/output devices are connected as bus master and bus slave circuits to the bus 12. In the present illustration, for example, long term memory 15 may be joined to the PCI bus 12 as a bus slave circuit. Rather than the electro-mechanical hard disk drive which is typically used for long term memory, a flash EEPROM memory array may be used as the long term memory 15. Such a flash EEPROM memory array may be a single bit or a multi-level memory system (a memory system in which a memory cell may store more than one bit of data) and may include circuitry for controlling the operation of the memory array including all of the operations associated with reading, programming (writing), and erasing the memory array.

Figure 2:
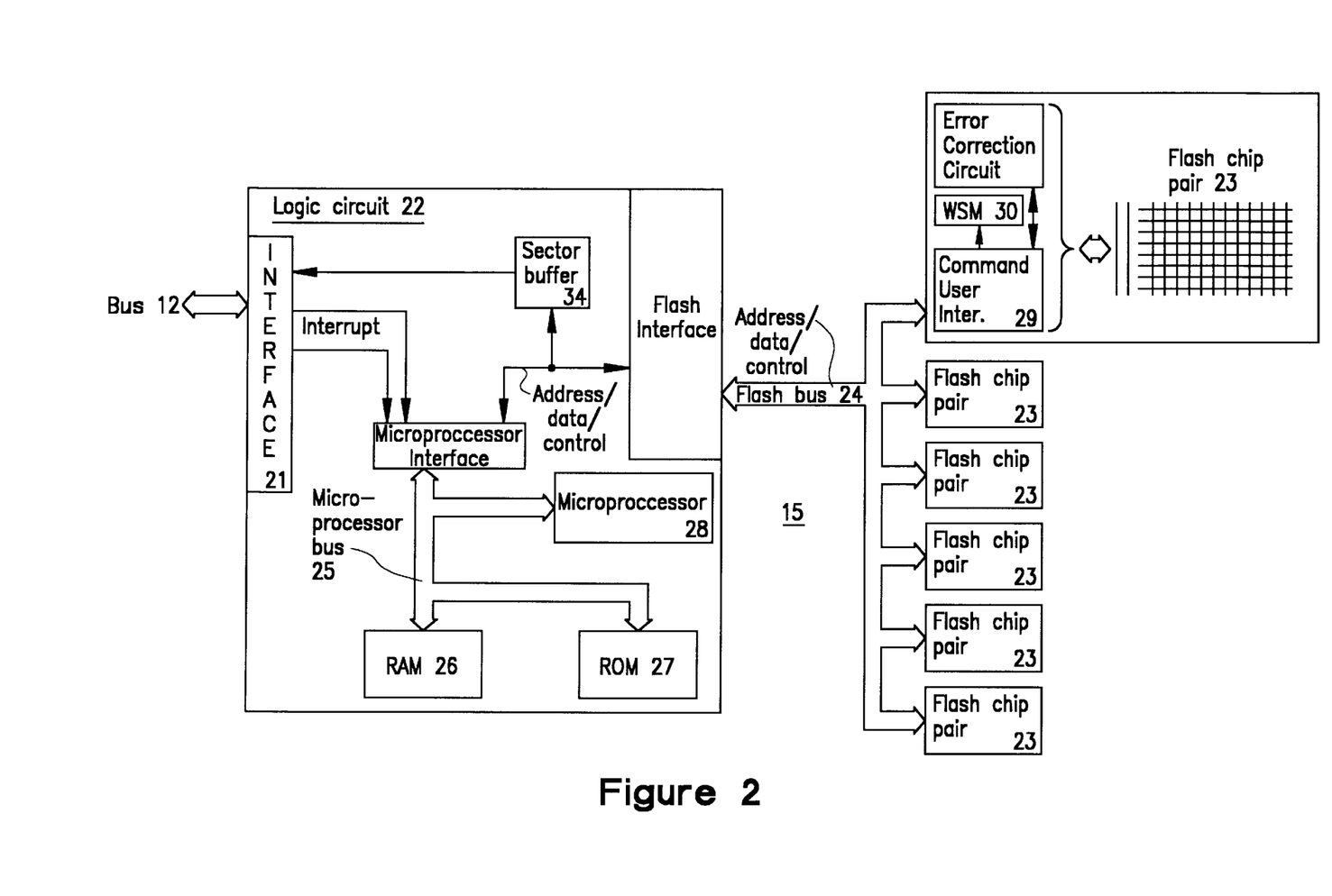
FIG. 2 is a block diagram of a flash EEPROM memory array designed in accordance with the present invention.

FIG. 2 illustrates in block diagram form a long term memory system 15 such as that illustrated in FIG. 1. In the present case, the memory system 15 is a microprocessor controlled flash EEPROM memory array. The memory system 15 is joined to the bus 12 through an interface 21. The interface 21 provides appropriate circuitry for decoding signals furnished on the bus 12 to a logic circuit 22. In one embodiment, the logic circuit 22 is an application specific integrated circuit (ASIC) which provides logic for implementing and coordinating the various operations of the flash memory system 15 such as reading, writing, erasing, and determining the status of the various portions of the flash EEPROM memory array. The logic circuit 22 functions as a command center and controls operations occurring in a plurality of flash EEPROM chip pairs 23 via a flash bus 24 so that those chips function together as a long term memory system.

The logic circuit 22 is assisted in its operations by a microprocessor 28 which is associated on a microprocessor bus 25 with random access memory 26, and read only memory 27. For the purposes of the present invention, the microprocessor 28, random access memory 26, and read only memory 27 together function essentially as a general purpose processor in a manner well known to those skilled in the art. The microprocessor 28 is used, among other things, for implementing commands to the memory system 15 for initiation of various operations of the array. The read only memory 27 is utilized in one embodiment to store processes utilized by the microprocessor 28 in operating the memory system 15.

In one embodiment, each pair of flash EEPROM memory chips 23 includes thirty-two individually-erasable blocks each including sixty-four kilobytes of flash EEPROM memory cells with gating/sensing and decoding circuitry for controlling the bitlines and output sensing devices of the array. Each chip of the pair 23 includes one-half of the memory transistors of the thirty-two blocks and control circuitry for effecting, among other things, read, write, and erase operations in the individual memory cells of the blocks on that chip pair 23. Each flash chip pair 23 is joined to the flash bus 24 by a command user interface 29 which provides command signals to that particular chip pair 23 from the logic circuit 22 and controls the transfer of data between the memory system 15 and the chip pair 23. Read commands are executed within each chip pair 23 entirely under control of the command user interface. The command user interface 29 is associated with a write state machine 30 which is utilized to control write operations and certain internal operations of the chip pair 23.

U.S. patent application Ser. No. 969,131, entitled A Method and Circuitry For A Solid State Memory Disk, Wells and Hasbun, filed Oct. 30, 1992, and assigned to the assignee of the present invention provides a further description of one arrangement for controlling the operation of a flash EEPROM memory array.

In general, the chip pairs of a flash EEPROM memory array are divided into blocks which are connected so that each entire block of memory cells may be erased simultaneously. With N-type complimentary metal-oxide-silicon (CMOS) memory devices, this erasure is typically accomplished by a high voltage value applied simultaneously to the source terminals of all the memory transistors of a block while the gate terminals of the devices are grounded and the drain terminals are floated. Such an erasure places each of the devices in the block into the erased condition. When in the erased condition, a device may be programmed to place a particular charge level on the floating gate. Typically, only one charge level greater than the erased level has been utilized; and this level has been referred to as a "zero" or programmed condition. The erased state has been called a "one" or erased condition. More recently, it has been found that a number of levels of charge in addition to the erased level may be stored on the floating gate of a flash EEPROM cell.

Whether one or more bits are stored in a cell, since all of the source terminals of the memory transistors of a block of the array are joined together, a cell in a charged state cannot be switched to the erased state until the entire block of the array is erased once again. Thus, while an electro-mechanical hard disk drive typically stores information in a first area of the disk and then rewrites that same area of the disk when the information changes, this is not possible with a flash EEPROM memory array without erasing all of the valid information that remains in that portion of the array along with the invalid information. Consequently, in prior art arrangements, when the information at a data entry changes, the changed information is written to a new sector on a block of the array containing empty (erased) cells rather than written over the old data; and the old data is marked as invalid. Then, after a sufficient number of sectors on a block have been marked invalid, the entire block is erased.

Because of this arrangement by which data is replaced, each block of the array will after some time have a number of entries which are marked as invalid and cannot be used for storage. Consequently, the array fills with data as the data previously stored is changed; and a point will come when it is necessary to clear the invalid information from a block in order to provide space for new or changed information to be stored. When erasure of a block occurs, all of the remaining valid data stored in the block to be erased is written to an empty block; the space from which the data was read is marked invalid; and then the entire invalid block is erased and put back into use as a clean block of memory.

A problem which occurs in the operation of any memory array is that attempts to read, write, and erase that memory sometimes fail. Failures may occur for many reasons. Some of these failures may be due to the physical failure of the array while others are caused by some form of extraneous signal. In order to determine when errors have occurred, various forms of error detection have been utilized in flash EEPROM and other types of memories. These error detection arrangements may be as simple as parity checking arrangements in which a parity bit is included with the data in each row and column of an array and set to provide an even or odd number of ones in each such row and column. Other more complicated forms of error detection have also been used. For example, an error detection and correction code may be generated from data being stored in a memory using a number of well known algorithms and stored with each sector of data on the flash EEPROM array. When the data is later read, a new error code is generated from the data and compared to the stored code. If the codes are not identical, an error has occurred. Error detection and correction codes of these types are well known to those skilled in the art and are widely used in protecting data stored on electro-mechanical hard disks. Examples of error correcting code and the operation such code performs are detailed, for example, in *Practical Error Correction Design For Engineers,* Revised 2d Edition, Glover and Trent, published by Cirrus Logic Press, copyright 1990.

In one embodiment of a flash memory, algorithms for generating error detection and code are stored in the read only memory 27 and run by the microprocessor 28 as data is written to the memory array. When the data is read, the microprocessor 28 regenerates the code and accomplishes the comparison. If the microprocessor 28 detects an error in the data read, it may use the error detection and correction code to correct certain software errors. If the error is uncorrectable, the microprocessor 28 may store data in a data structure in RAM 26 indicating the position of the error and consider it a hardware error. A second error at the same position may indicate that it is indeed a hardware error.

In a less advanced embodiment of a flash memory, an algorithm for generating error detection code is stored in memory and run by a controller or other programmable apparatus of the command user interface 29 as data is written to the memory blocks of that chip. The controller is a programmable apparatus like the microprocessor 28 and accomplishes the same type of detection when the data is read from the chip as does the microprocessor 28 in the more advanced version. If an error is detected, it may be stored on the block of the array having the error. As with the advanced arrangement, a second error at the same position may indicate a hardware error.

Various other error detecting and correcting schemes are available and may be used for detecting and correcting errors. However, such schemes are not a part of this invention and, therefore, are not discussed further.

In prior art flash EEPROM arrays, if a block of the array is found during operation to have developed a hardware error which cannot be corrected, then that block of the array has been marked as bad and retired from use.

Blocks of flash memory are relatively expensive compared to other forms of storage, so this is an undesirable characteristic. Moreover, since there are only a limited number of spare blocks of flash memory in an array, ultimately, this approach to error correction limits the ability of the array to function. If there is insufficient memory to write the valid data from a block which should be erased because it contains a great deal of invalid data, then the block cannot be erased. As the remainder of the empty space fills, there becomes no way to erase the accumulating invalid data. A manner of overcoming this problem is to reserve more blocks, but this is even more expensive. Consequently, it is desirable to provide a way to correct errors in hardware so that the blocks containing these errors may be put back in service.

The present invention accomplishes this result by utilizing test hardware and redundant array circuitry which exists on the flash chips for increasing the manufacturing yield. The redundant array circuitry placed on each flash chip has been used to replace elements of the flash arrays when those elements are found to be bad during the manufacturing process. In the most common form, this circuit includes one or more redundant columns for the row and column array of each block which may be placed into circuit with the block in place of columns which testing shows to be bad. Typically, a test finds a bad column and replaces that column with a good redundant column by storing data in memory cells on the chip which cause the redundant column to be accessed whenever the column it replaces is addressed. Once this data is stored on the chip, the chip is utilized in a normal manner and functions like any other flash memory chip.

Figure 3:
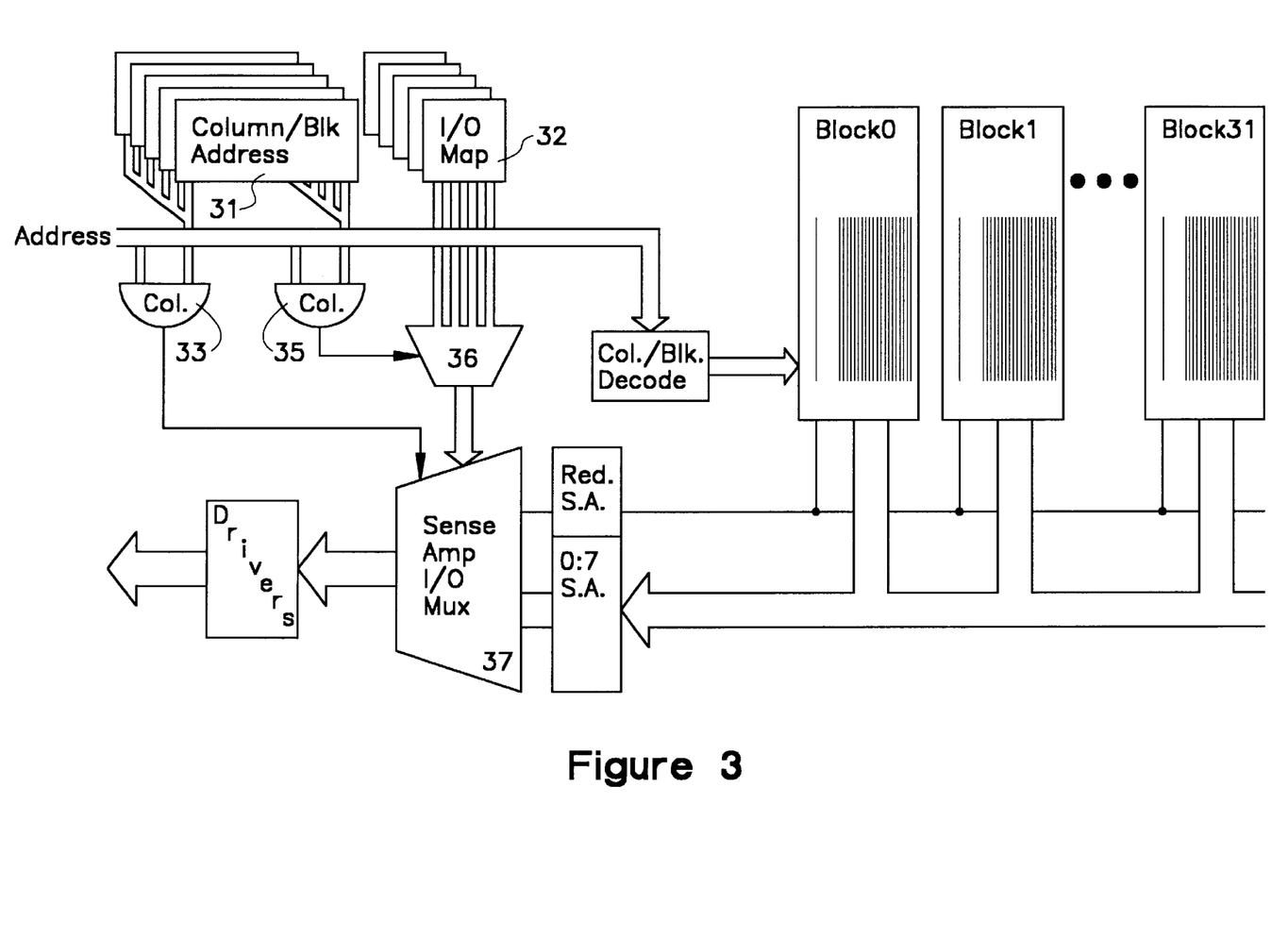
FIG. 3 is a block diagram of circuitry which may be utilized with the present invention.

FIG. 3 is a block diagram of circuitry utilized on one type of flash EEPROM chip for replacing bad columns with redundant columns. The circuitry includes a programmable read-only memory 31 (such as a flash EEPROM) and an input/output (I/O) map 32 for addressing each of the blocks. The memory 31 is typically used to store the addresses of those columns which are found during manufacturing testing to have hardware errors. The input/output map 32 is used for accessing each particular block [0:31] of the array.

Each of the blocks illustrated is, for the purpose of this specification, assumed to have a single redundant column which may be substituted for a bad column in the block. If a column is found to be bad, the address of that column and block is stored in the memory 31, and the input/output map 32 for accessing the particular block is programmed to delete that column from the map. As the array is accessed, a comparison of blocks addresses selects a particular I/O map 32 and its associated memory 31 by means of an AND gate 35 and a multiplexor 36. Then as the array is accessed, the column addresses for each selected block are compared to the bad column addresses stored in the memory 31 for that block. If an address of a column being accessed is the same as the bad column address stored in the memory 31, an AND gate 33 detects this fact. The AND gate 33 and the multiplexor 35 furnish signals which cause a multiplexor 37 to enable the output produced by a sense amplifier from the redundant column and from sense amplifiers from the columns selected using the I/O map 32 for that block. The value from the redundant column is then furnished along with the other column output lines by selection at the multiplexor 37. Thus, on each access, the redundant column is substituted for the bad column whenever the bad column is addressed.

Figure 4:
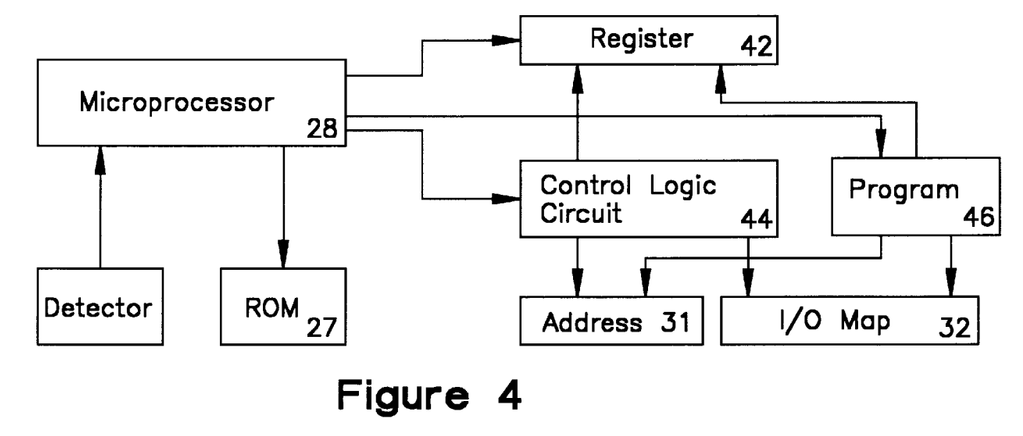
FIG. 4 is a block diagram illustrating a first arrangement in accordance with the present invention.

The present invention makes use of redundancy circuitry such as that described which is typically in place on the chip for correction during operation of errors detected. This is accomplished in one embodiment as is illustrated in FIG. 4 by providing a signal to the microprocessor 28 indicating that a hardware error has occurred and indicating its address. This causes the microprocessor 28 to run a process stored in the ROM 27 which replaces the bad column with the redundant column in the same manner that it is replaced during manufacturing testing. For example, the microprocessor 28 may provide the bad column address to a control register 42 and generate signals to cause control logic circuit 44 to access the I/O map 32 at the bad block address contained in the control register 42 so that the bad column may be disabled. When the I/O map 32 is so accessed, the microprocessor 28 may cause programming circuitry 46 to disable the bad column in the I/O mapping circuit 32. The microprocessor 28 may also cause control circuit 44 to select the associated memory 31 and the programming circuitry 46 to write the bad column and block address in the memory 31 so that it will be detected when the bad column is next accessed.

As those skilled in the art will understand, a number of redundant columns may appear in each block of memory, and all of these columns may be utilized so that more than one bad column may be replaced in any particular block of the array. In like manner, an array may include redundant rows of memory devices; and similar circuitry may be utilized to replace during the operation of the array bad rows of the blocks discovered.

In this manner, the redundant column circuitry replaces the bad column whenever the bad column is accessed during the period of operation of the flash array. Since bad columns are replaced during operation, it is no longer necessary to remove blocks of flash memory from the array as hardware errors are discovered during operation.

Figure 5:
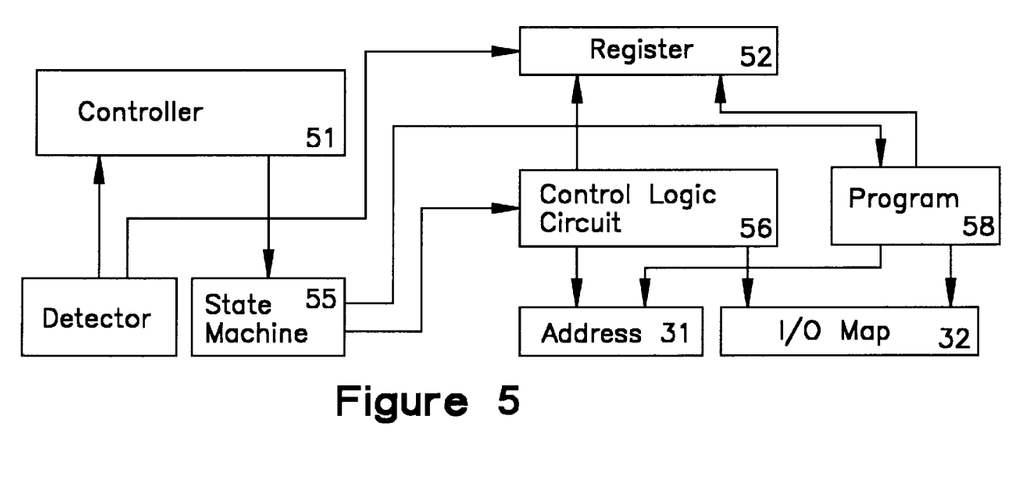
FIG. 5 is a block diagram illustrating a second arrangement in accordance with the present invention.

FIG. 5 illustrates a second embodiment of the invention. In this embodiment, signals indicating a hardware error are sent to the controller 51 of the command user interface 29; and the address of the bad column is placed by the detection circuitry 53 in a register 52. The controller 51 then initiates a process by a state machine 55 which causes control logic circuit 56 to access the I/O map 32 at the bad block address contained in the control register 52, and programming circuitry 58 to disable the bad column in the I/O mapping circuit 32. The state machine 55 may also cause control logic circuit 56 to select the associated memory 31 and the programming circuitry 58 to write the bad column and block address in the memory 31 so that it will be detected when the bad column is next accessed.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. Error correction apparatus for a flash EEPROM array comprising
   a block of flash EEPROM devices joined in row and column array circuits by which the flash EEPROM devices may be accessed,
   said block including an access circuit for accessing the redundant flash EEPROM devices during production of the flash EEPROM array and operation of the EEPROM array;
   means for sensing when a hardware error has occurred in a block of the flash EEPROM array during the operation of the array, and
   a circuit for replacing an array circuit having an error during the operation of the array and during production of the array by a redundant circuit, accessible by the access circuit in response to detection of a hardware error or a manufacturing error, respectively, with a circuit by which redundant flash EEPROM devices may be accessed.

2. Error correction apparatus for a flash EEPROM array as claimed in claim 1 in which the means for sensing when a hardware error has occurred in a block of the flash EEPROM array during the operation of the array comprises:
   a programmable apparatus, and
   a memory storing a process for detecting hardware errors for directing operations of the programmable apparatus.

3. Error correction apparatus for a flash EEPROM array as claimed in claim 2 in which the programmable apparatus is a controller which runs processes for accessing the block in which the error has occurred.

4. Error correction apparatus for a flash EEPROM array as claimed in claim 2 in which the programmable apparatus is a microprocessor which runs processes for controlling the flash EEPROM array.

5. Error correction apparatus for a flash EEPROM array as claimed in claim 1 in which the circuit for replacing an array circuit having an error during the operation of the array with a circuit by which redundant flash EEPROM devices may be accessed in response to detection of a hardware error comprises:
   a programmable apparatus, and
   a memory storing a process for directing operations of the programmable apparatus to replace bad array circuits,
   a memory for storing an address of a bad array circuit provided by the means for sensing when a hardware error has occurred,
   a comparator for comparing the address of a bad array circuit and addresses being accessed and providing a signal indicating an attempt to access a bad address;
   an input/output map indicating circuits to be accessed for each address,
   programming circuitry for reprogramming the input/output map to exclude the bad array circuit from accessible circuits, and
   an enabling circuit for the circuit by which redundant flash EEPROM devices may be accessed, the enabling circuit being responsive to a signal indicating an attempt to access a bad address.

6. Error correction apparatus for a flash EEPROM array as claimed in claim 5 in which the means for sensing when a hardware error has occurred in a block of the flash EEPROM array during the operation of the array comprises:

a memory storing a process for detecting hardware errors for directing operations of the programmable apparatus.

7. Error correction apparatus for a flash EEPROM array as claimed in claim 6 in which the programmable apparatus is a controller which runs processes for accessing the block in which the error has occurred.

8. Error correction apparatus for a flash EEPROM array as claimed in claim 6 in which the programmable apparatus is a microprocessor which runs processes for controlling the flash EEPROM array.

9. Error correction apparatus for a flash EEPROM array as claimed in claim 1 in which the circuit for replacing an array circuit having an error is a column array circuit.

10. Error correction apparatus for a flash EEPROM array as claimed in claim 1 in which the circuit for replacing an array circuit having an error is a row array circuit.

11. Error correction apparatus for a flash EEPROM array comprising:

a block of flash EEPROM devices joined in row and column array circuits by which the flash EEPROM devices may be accessed,
said block including an access circuit for accessing the redundant flash EEPROM devices during production of the flash EEPROM array and operation of the EEPROM array;
means for sensing when a hardware error has occurred in a block of the flash EEPROM array during the operation of the array, and
means for replacing an array circuit having an error during the operation of the array and during production of the array by a redundant circuit, accessible by the access circuit in response to detection of a hardware error or a manufacturing error, respectively, with a circuit by which redundant flash EEPROM devices may be accessed.

12. Error correction apparatus for a flash EEPROM array as claimed in claim 11 in which the means for replacing an array circuit having an error during the operation of the array with a circuit by which redundant flash EEPROM devices may be accessed in response to detection of a hardware error comprises:

programmable means, and
means storing a process for directing operations of the programmable means to replace bad array circuits,
means for storing an address of a bad array circuit provided by the means for sensing when a hardware error has occurred,
means for comparing the address of a bad array circuit and addresses being accessed and providing a signal indicating an attempt to access a bad address;
mapping means indicating circuits to be accessed for each address,
programming means for reprogramming the mapping means to exclude the bad array circuit from accessible circuits, and
enabling means for the circuit by which redundant flash EEPROM devices may be accessed, the enabling means being responsive to a signal indicating an attempt to access a bad address.

13. Error correction apparatus for a flash EEPROM array as claimed in claim 12 in which the means for sensing when a hardware error has occurred in a block of the flash EEPROM array during the operation of the array comprises:

means storing a process for detecting hardware errors for directing operations of the programmable means.

14. Error correction apparatus for a flash EEPROM array as claimed in claim 13 in which the programmable means resides on a chip with the block of flash EEPROM devices.

15. Error correction apparatus for a flash EEPROM array as claimed in claim 13 in which the programmable means controls the operations of the entire flash EEPROM array.

16. A computer system comprising:

a central processing unit;
a system bus;
main memory; and
a flash electrically-erasable programmable read only memory (EEPROM) array comprising:
a block of flash EEPROM devices joined in row and column array circuits by which the flash EEPROM devices may be accessed,
said block including an access circuit for accessing redundant flash EEPROM devices during production of the flash EEPROM array and operation of the EEPROM array;
an error correction circuit including:
means for sensing when a hardware error has occurred in a block of the flash EEPROM array during the operation of the array, and
a circuit for replacing an array circuit having an error during the operation of the array and during production of the array by a redundant circuit, accessible by the access circuit in response to detection of a hardware error or a manufacturing error, respectively, with a circuit by which redundant flash EEPROM devices may be accessed.

17. A computer system as claimed in claim 16 in which the means for sensing when a hardware error has occurred in a block of the flash EEPROM array during the operation of the array comprises:

a programmable apparatus, and
a memory storing a process for detecting hardware errors for directing operations of the programmable apparatus.

18. A computer system as claimed in claim 16 in which the circuit for replacing an array circuit having an error during the operation of the array and during production of the array by a redundant circuit, accessible by the access circuit in response to detection of a hardware error or a manufacturing error, respectively, with a circuit by which redundant flash EEPROM devices may be accessed comprises:

a programmable apparatus, and
a memory storing a process for directing operations of the programmable apparatus to replace bad array circuits,
a memory for storing an address of a bad array circuit provided by the means for sensing when a hardware error has occurred,
a comparator for comparing the address of a bad array circuit and addresses being accessed and providing a signal indicating an attempt to access a bad address;
an input/output map indicating circuits to be accessed for each address,
programming circuitry for reprogramming the input/output map to exclude the bad array circuit from accessible circuits, and
an enabling circuit for the circuit by which redundant flash EEPROM devices may be accessed, the enabling circuit being responsive to a signal indicating an attempt to access a bad address.

19. A computer system as claimed in claim 18 in which the programmable apparatus controls the operations of the entire flash EEPROM array.

20. A computer system as claimed in claim 18 in which the programmable apparatus resides on a chip with the block of flash EEPROM devices.

21. A method for correcting hardware errors of a flash memory array of a flash chip, said method of correcting hardware errors comprising the steps of:

a) detecting an occurrence of a hardware error during operation of a flash array; and b) employing test hardware and redundant array circuitry existing on the flash chip to correct hardware errors during the operation of the flash array, said test hardware and redundant array circuits used to replace defective array circuits in the flash array during production.

* * * * *